(12) United States Patent
Yutani

(10) Patent No.: US 6,437,968 B1
(45) Date of Patent: Aug. 20, 2002

(54) CAPACITIVE ELEMENT

(75) Inventor: Akie Yutani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/476,781

(22) Filed: Dec. 30, 1999

(30) Foreign Application Priority Data

Jul. 2, 1999 (JP) ............................................ 11-188349

(51) Int. Cl.$^7$ .............................................. H01G 4/228
(52) U.S. Cl. ................. 361/306.3; 361/313; 361/321.5; 361/311; 361/321.4; 438/398; 438/674
(58) Field of Search .............................. 361/306.3, 312, 361/321.5, 301.4, 303, 311, 305, 313, 322, 321.4, 280; 438/398, 674

(56) References Cited

U.S. PATENT DOCUMENTS

| 4,931,897 A | * | 6/1990 | Tsukamoto et al. | .......... 361/313 |
| 5,005,102 A | * | 4/1991 | Larson | .......... 361/313 |
| 5,471,363 A | * | 11/1995 | Mihara | .......... 361/305 |
| 5,576,928 A | * | 11/1996 | Summerfelt et al. | .......... 361/321.1 |
| 5,587,870 A | * | 12/1996 | Anderson et al. | .......... 361/313 |
| 5,605,858 A | * | 2/1997 | Nishioka et al. | .......... 437/60 |
| 5,612,547 A | * | 3/1997 | Summerfetl et al. | .......... 257/783 |
| 5,622,888 A | * | 4/1997 | Sekine et al. | .......... 438/398 |
| 5,978,207 A | * | 11/1999 | Anderson et al. | .......... 361/311 |

FOREIGN PATENT DOCUMENTS

JP          10-173149          6/1998

* cited by examiner

Primary Examiner—Chau N. Nguyen
Assistant Examiner—Nguyen Thuc Ha
(74) Attorney, Agent, or Firm—Oblon, Spivak, McClelland, Maier & Neustadt, P.C.

(57) ABSTRACT

An oxide dielectric film (7) is formed of barium strontium titanate to have a thickness of 300 to 600 Å, and a first platinum layer (81) is deposited thereon by, e.g., sputtering at a temperature not higher than 250° C. to have a thickness of 250 to 500 Å. Further, a second platinum layer (82) is deposited on the first platinum layer (81) by, e.g., sputtering at a temperature of 250 to 500° C. to have a thickness of 250 to 500 Å. Since the first platinum layer (81) has less grain boundary and is hard to connect to that of the second platinum layer (82), with less grain boundary diffusion caused, even if a hydrogen sintering of an aluminum interconnection layer (11) is performed, reduction species are unlikely to reach the oxide dielectric film (7) through the grain boundary. That suppresses deterioration of the oxide dielectric film (7) to avoid an increase of leak current therein. Moreover, since the surface area of the second platinum layer (82) increases, the adherence between the second platinum layer (82) and an interlayer insulating film (10) provided thereon is improved.

14 Claims, 11 Drawing Sheets

CAPACITIVE ELEMENT

BACKGROUND OF THE INVENTION

1. Field of the Invention

The present invention relates to a semiconductor memory device and a method of manufacturing the same, and more particularly to a capacitive element.

2. Description of the Background Art

Conventionally, to enhance permittivity or obtain ferroelectricity of a dielectric included in a capacitive element such as a capacitor, for higher integration with capacitance value ensured, use of an oxide dielectric film has been proposed. As an example of the oxide dielectric film, an oxide dielectric of perovskite system can be taken.

In a capacitor using the oxide dielectric film, a precious metal electrode is used. For the electrode is required not to be oxidized since an ambient atmosphere needed for forming an oxide dielectric film has an oxidizing power There are two problems, however, in using the precious metal electrode as follows. The first problem is that the precious metal electrode has a poor adherence to an interlayer insulating film covering a capacitor and hence the precious metal electrode is removed from the interlayer insulating film in formation or after formation of the precious metal electrode.

The second problem is that the oxide dielectric film is reduced when a hydrogen sintering is performed, where an aluminum interconnection line connected to the capacitor is heat-treated in hydrogen. As the oxide dielectric film is reduced, oxygen deficiency in crystal grains of the oxide dielectric increases and a leak current flowing through deficiency level based thereon disadvantageously increases.

Although techniques to solve the first and second problems, such as interposing a so-called adhesion layer between the precious metal electrode and the interlayer insulating film and interposing a block layer having reduction species, have been proposed, the process becomes complicated and some dedicated facilities are needed.

A technique for upper electrode of layered structure is disclosed in Japanese Patent Application Laid Open Gazette No. 10-12844 as a technique of removing adsorbed water in an interface between the upper electrode of the capacitor and the interlayer insulating film, in Japanese Patent Application Laid Open Gazette No. 8-274270 as a technique of suppressing diffusion of, for example, lead from the oxide dielectric of perovskite and Japanese Patent Application Laid Open Gazette No. 9-139476 as a technique of suppressing out-of-composition of the dielectric film. A technique for lower electrode of layered structure is disclosed in Japanese Patent Application Laid Open Gazette Nos. 8-274270, 10-173149, 7-94680, 10-173138 and 9-139476.

SUMMARY OF THE INVENTION

The present invention is directed to a capacitive element. According to a first aspect of the present invention, the capacitive element comprises: a lower electrode; a dielectric layer formed on the lower electrode; and an upper electrode having a first layer formed on the dielectric layer and a second layer formed on the first layer and having a grain size larger than the first layer.

According to a second aspect of the present invention, in the capacitive element of the first aspect, the second layer is formed at higher temperature than the first layer.

According to a third aspect of the present invention, in the capacitive element of the first aspect, the second layer has higher concentration of oxidizer than the first layer.

According to a fourth aspect of the present invention, in the capacitive element of the third aspect, the second layer is formed in an atmosphere with higher concentration of oxidizer than the first layer.

According to a fifth aspect of the present invention, in the capacitive element of the first aspect, the upper electrode further has a third layer formed between the first and second layers and having a grain size larger than the second layer.

According to a sixth aspect of the present invention, the capacitive element comprises: a lower electrode formed on a substrate; a dielectric layer formed on the lower electrode and being thinner than the low electrode; and an upper electrode formed on the dielectric layer. In the capacitive element of the sixth aspect, unevenness in a surface of the lower electrode on the side of the dielectric layer is not larger than a tenth of the thickness of the dielectric layer and cycle of the unevenness in a direction parallel with the substrate is not larger than a half of the size of the lower electrode in the direction parallel with the substrate.

According to a seventh aspect of the present invention, in the capacitive element of the sixth aspect, the lower electrode has a first layer formed on the substrate and a second layer formed on the first layer, and the first layer is formed at higher temperature than the second layer.

According to an eighth aspect of the present invention, in the capacitive element of the seventh aspect, the lower electrode further has a third layer formed between the first and second layers and having a grain size larger than the first layer.

According to a ninth aspect of the present invention, in the capacitive element of the fifth or eighth aspect, the third layer is formed at higher temperature than the first and second layers.

In the capacitive element of the first aspect of the present invention, since the second layer of said upper electrode has less grain boundary and is hard to connect to that of the first layer, with less grain boundary diffusion caused, even if a hydrogen sintering is performed, reduction species are unlikely to reach the dielectric layer through the grain boundary. Further, since the surface area of the second layer increases, deterioration of the dielectric layer is suppressed and the adherence between the second layer and the interlayer insulating film if provided thereon is improved.

In the capacitive element of the second aspect of the present invention, crystal grains formed in the second layer are larger than those formed in the first layer In the capacitive element of the third aspect of the present invention, since the oxidizer blocks transmission of reduction species in the second layer, the reduction species are unlikely to reach the dielectric layer.

In the capacitive element of the fourth aspect of the present invention, since an oxide is likely to be adsorbed to the first layer in formation of the second layer and inhibits movement of atoms constituting the second layer, granular growth is caused in the second layer to increase the surface area thereof.

In the capacitive element of the fifth aspect of the present invention, providing the third layer improves the effect of blocking transmission of reduction species while an increase of crystal grains in the second layer farthest from the electric layer is suppressed so that a good contact to the second layer may be obtained.

In the capacitive element of the sixth aspect of the present invention, since the unevenness in the surface of the lower electrode on the side of the dielectric layer, it is possible to suppress electric field concentration in the dielectric layer.

In the capacitive element of the seventh aspect of the present invention, the first layer and the lower electrode cause a chemical reaction to enhance adherence, while growth of crystal grains is suppressed in the second layer, to achieve evenness in the surface.

In the capacitive element of the eighth aspect of the present invention, providing the third layer improves the effect of the seventh aspect.

In the capacitive element of the ninth aspect of the present invention, crystal grains formed in the third layer are larger than those formed in the first and second layers.

An object of the present invention is to enhance adherence between an electrode and an interlayer insulating film without providing additional adhesion layer or block layer, that is, without additional facility or complicated process. Another object of the present invention is to suppress diffusion of reducing gas and prevent an increase of leak current in a dielectric.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

FIGS. 1 to 16 are cross sections showing a method of manufacturing a semiconductor device (e.g., DRAM) in accordance with the first preferred embodiment of the present invention step by step.

Figure 1:
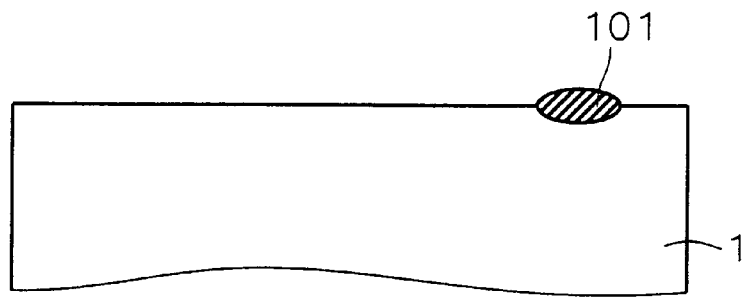
FIGS. 1 to 16 are cross sections showing a method of manufacturing a semiconductor device in accordance with a first preferred embodiment of the present invention step by step.
Figure 2:
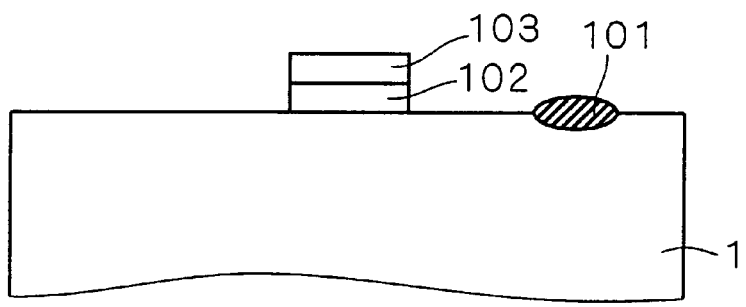
Figure 3:
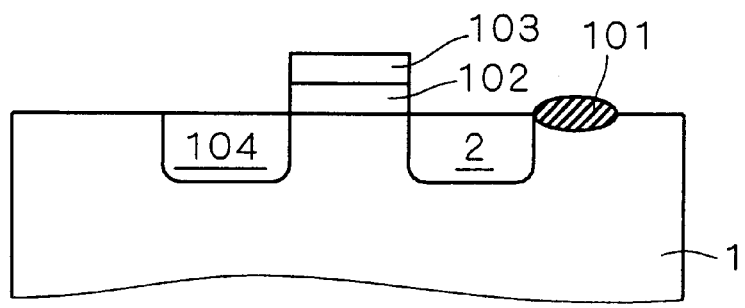
Figure 4:
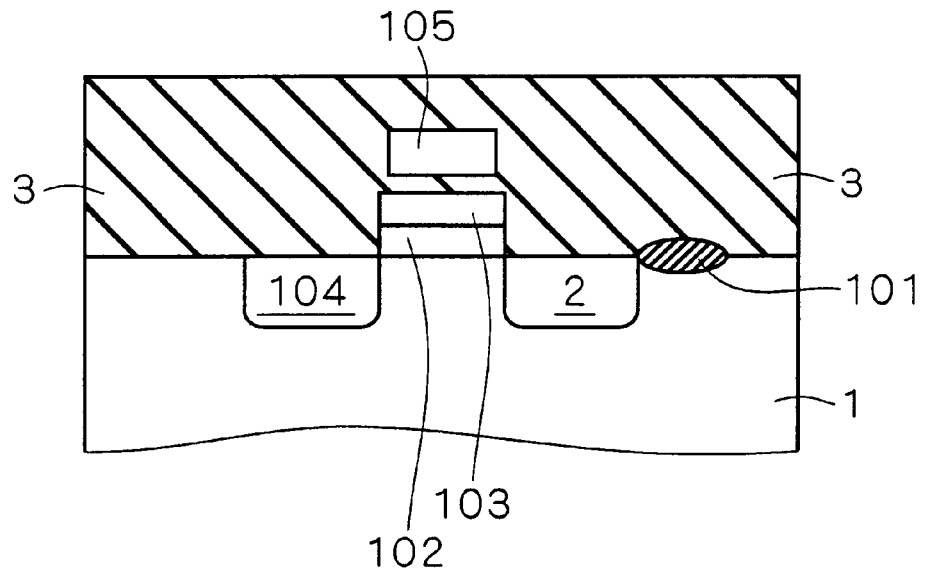

In a surface of a semiconductor substrate 1 using, e.g., a silicon, an oxide film 101 is formed by, e.g., trench isolation or LOCOS isolation, to obtain a structure of FIG. 1. Subsequently, a layered structure of a gate oxide film 102 having a thickness of, e.g., several tens Å and a gate electrode 103 is formed on the surface of the semiconductor substrate 1 away from the oxide film 101, to obtain a structure of FIG. 2. A drain region 2 and a source region 104 are formed by lithography technique and ion implantation at a dose of, e.g., $1 \times 10^{15} cm^2$ in the surface of the semiconductor substrate 1 so as to sandwich the gate electrode 103, to obtain a structure of FIG. 3. A bit line 105 using, e.g., tungsten is formed above the gate electrode 103. Further, an interlayer insulating film 3 is formed around the bit line 105 and over the structure of FIG. 3 (see FIG. 4). Then, a plug 4 is formed of, e.g., doped polysilicon so as to penetrate the interlayer insulating film 3 to come into contact with the drain region 2, to obtain a structure of FIG. 5.

Figure 5:
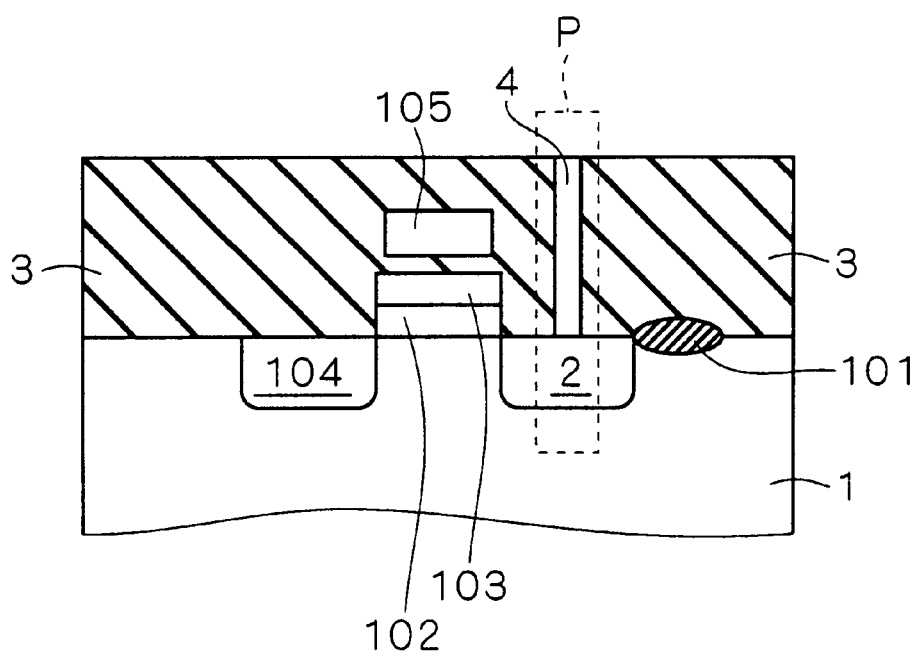
Figure 6:
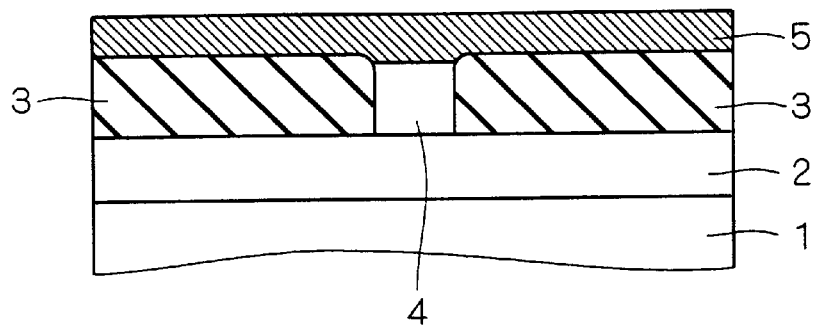
Figure 7:
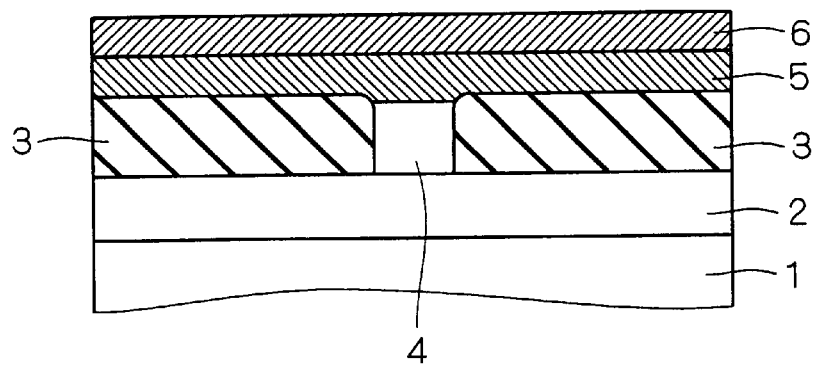

On the structure of FIG. 5, a barrier metal of a lower electrode is formed, e.g., titanium nitride, to obtain a structure of FIG. 6. In FIGS. 6 to 16, only a region corresponding to a region P of FIG. 5 indicated by a broken line is shown. As the barrier metal 5, for example, a layered film of titanium nitride (TiN) of 1000 Å/titan (Ti) of 100 Å is used. On the barrier metal 5, a lower-electrode base metal 6 having a thickness of 1000 Å is formed of a metal, especially, a precious metal, e.g., platinum (Pt), to obtain a structure of FIG. 7. The barrier metal 5 and the lower-electrode base metal 6 are reshaped by photolithography and etching so as to be left above the plug 4 and its periphery by, e.g., 0.2 $\mu$m in width, to obtain a structure of FIG. 8.

Figure 8:
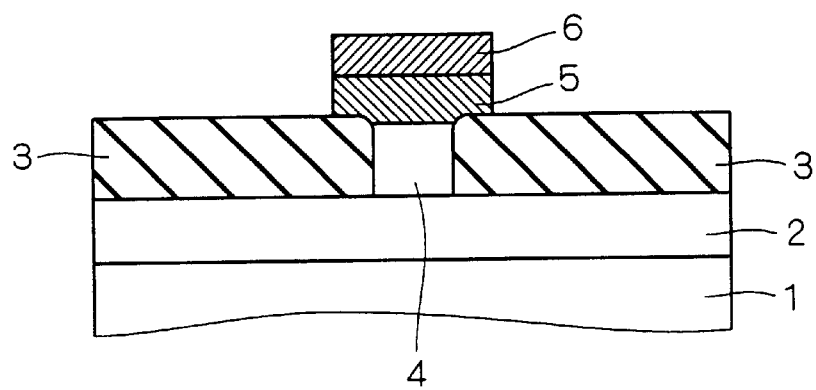
Figure 9:
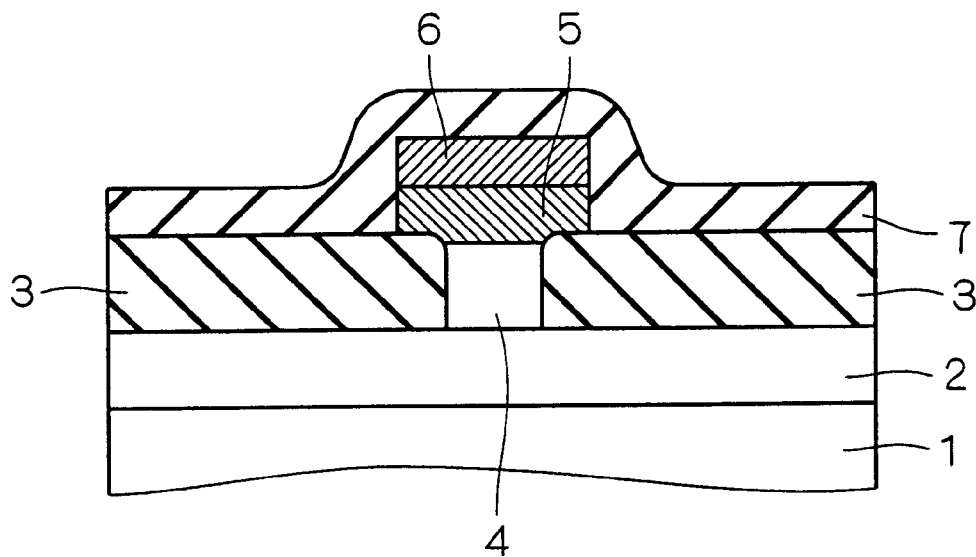
Figure 10:
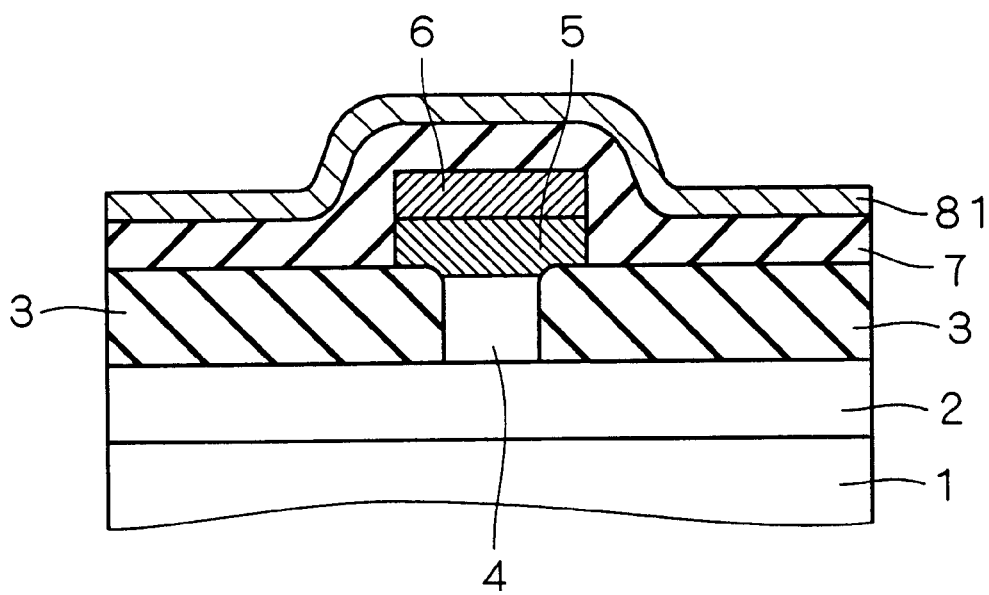
Figure 11:
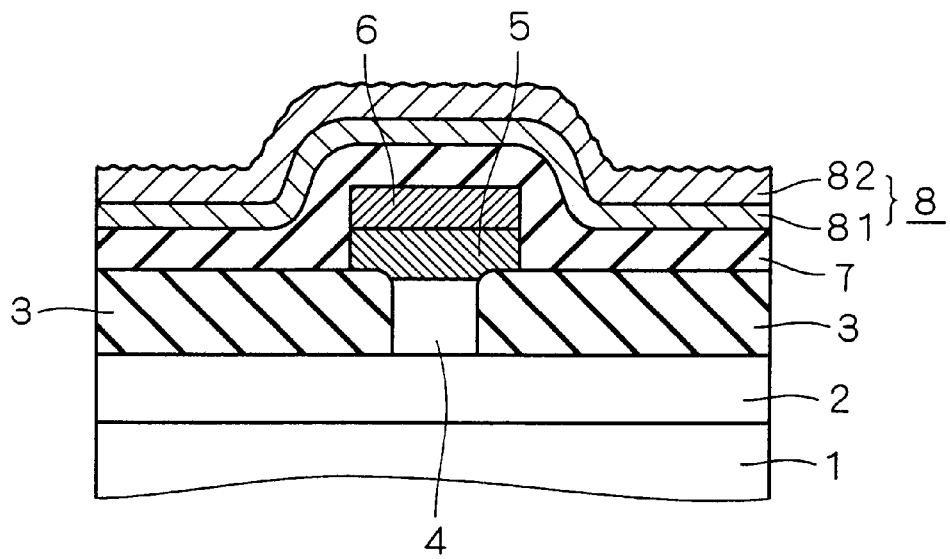

Next, on the structure of FIG. 8, an oxide dielectric film 7 having a thickness of, e.g., 300 to 600 Å is formed of, e.g., barium strontium titanate ((Ba, Sr)TiO$_3$), to obtain a structure of FIG. 9. On the oxide dielectric film 7, a first layer 81 is formed of a metal, especially, a precious metal, e.g., platinum (Pt) by, e.g., sputtering, to obtain a structure of FIG. 10. Deposition is performed at a low temperature not lower than a room temperature to not higher than 250° C. to form a film thickness of 250 to 500 Å. Such a setting of the temperature in deposition makes it possible to form a wavy pattern in a cycle gentler as compared with the size of a storage node, i.e., depth, width and height (e.g., each about 0.2 $\mu$m) of the barrier metal 5 and the lower electrode 6 as a whole. Further, on the first layer 81, a second layer 82 is formed of a metal, especially, a precious metal, e.g., platinum (Pt) by, e.g., sputtering, to obtain a structure of FIG. 11. Deposition is performed at a high temperature in a range from 250 to 500° C. to form a film thickness of 250 to 500 Å. Such a setting of the temperature in deposition allows growth of smaller crystal grains as compared with the size of the storage node to increase surface area. Thus, the first and second layers 81 and 82 constitute an upper electrode 8 of the capacitor.

Figure 12:
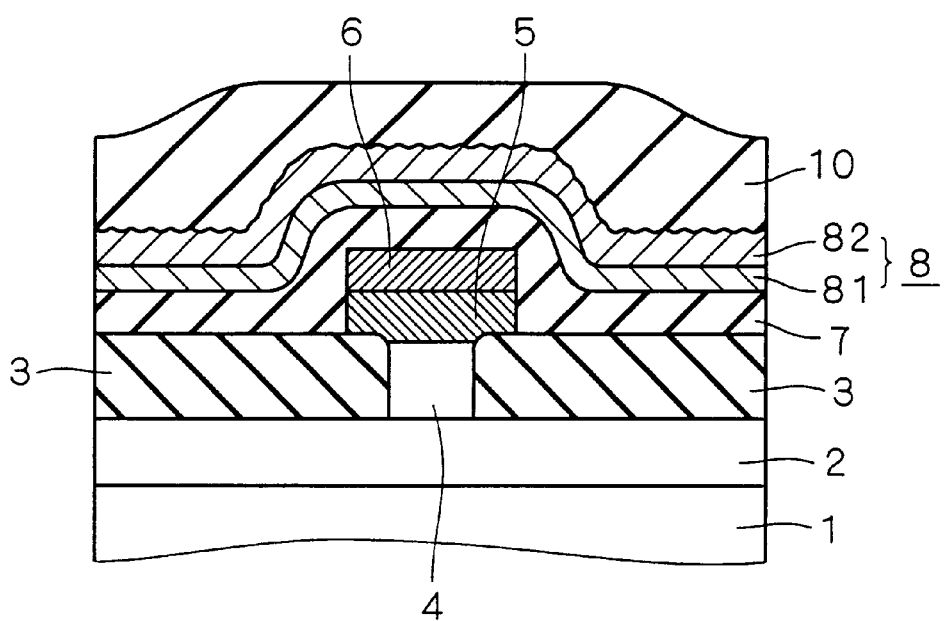
Figure 13:
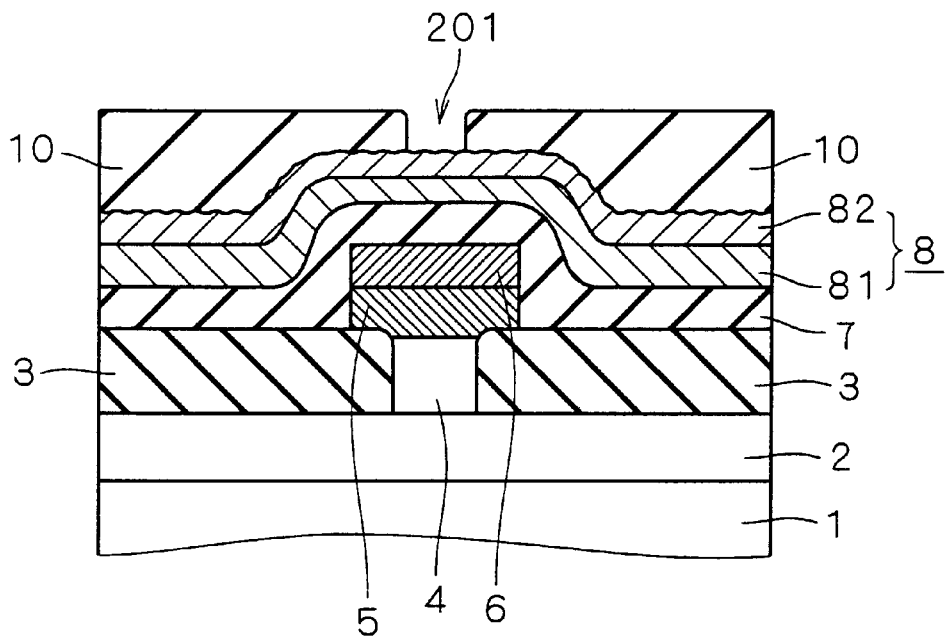
Figure 14:
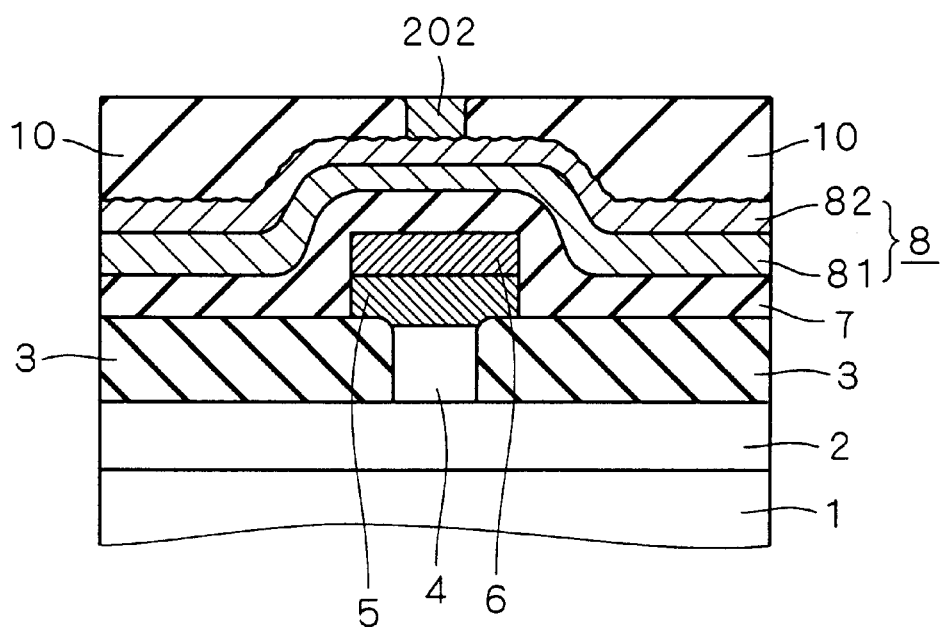
Figure 15:
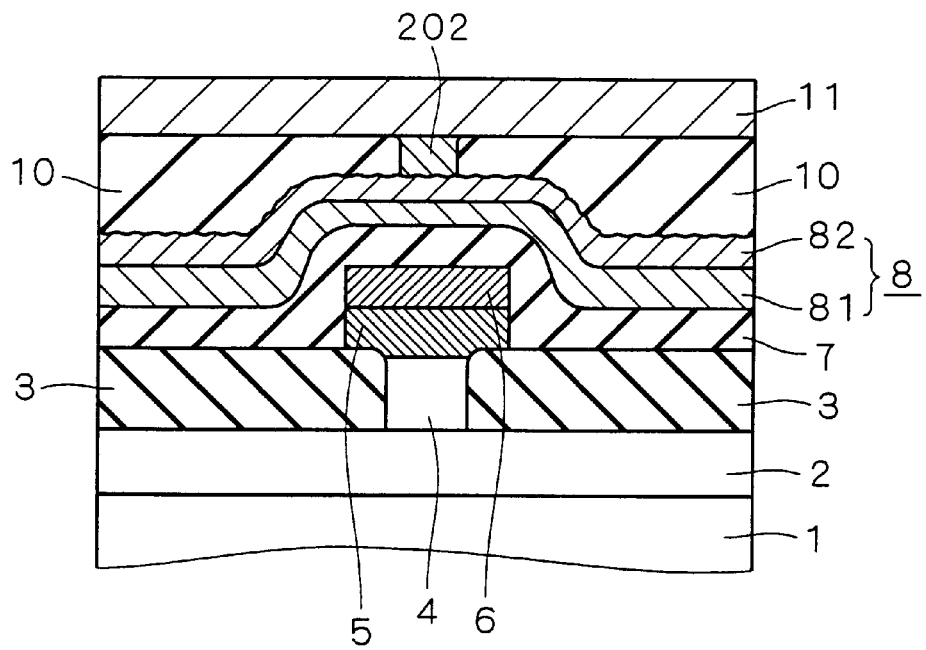
Figure 16:
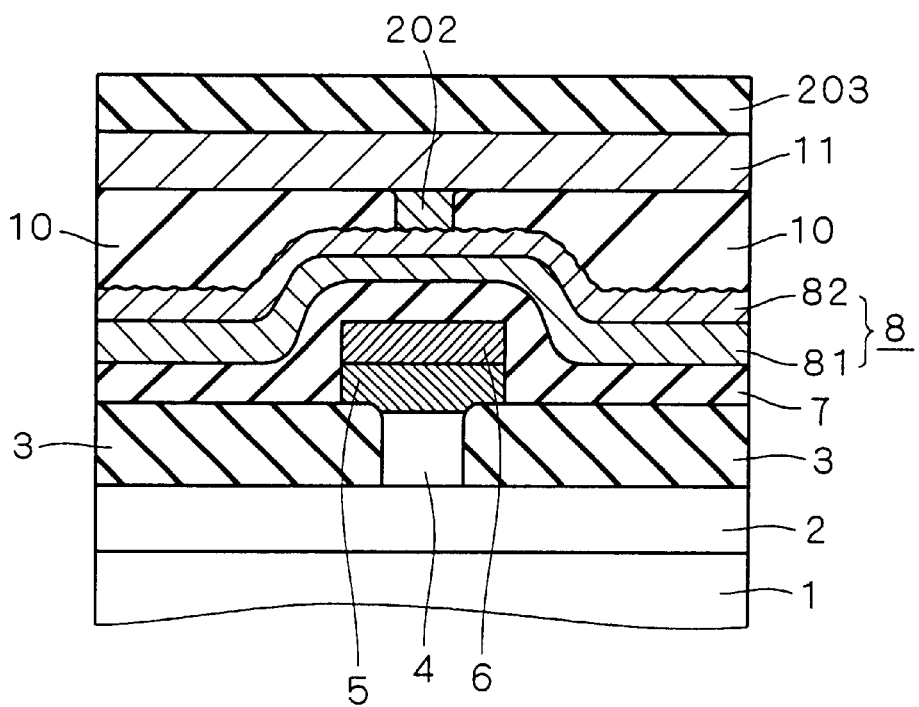

Next, on the second layer 82, an interlayer insulating film 10 is formed of, e.g., a silicon oxide film, to obtain a structure of FIG. 12. The interlayer insulating film 10 is opened by lithography technique and etching above the lower-electrode base metal 6 and the barrier metal 5, to form an opening 201 of FIG. 13. Then, the opening 201 is filled with a plug 202, to obtain a structure of FIG. 14. After that, an aluminum interconnection layer 11 is formed, coming into contact with the plug 202, to obtain a structure of FIG. 15. Further, an SiN is formed by, e.g., plasma CVD, or a passivation film 203 is provided by using polyimide, to obtain a structure of FIG. 16. Furthermore, there may be a case where the process of FIG. 14 is omitted and the opening 201 is filled with the aluminum interconnection layer 11 when the layer 11 is formed.

In the upper electrode 8 formed as above, since the first layer 81 has less grain boundary and is hard to connect to that of the second layer 82, with less grain boundary diffusion caused, even if a hydrogen sintering of the aluminum interconnection layer 11 is performed, reduction species are unlikely to reach the oxide dielectric film 7 through the grain boundary. That suppresses deterioration of the oxide dielectric film 7. Moreover, since the surface area of the second layer 82 increases, the adherence between the second layer 82 and the interlayer insulating film 10 provided thereon is improved. Therefore, it is possible to solve the first and second problems.

The Second Preferred Embodiment

Though the upper electrode is constituted of a layered structure of the first and second layers 81 and 82 which are deposited at different temperatures in the first preferred embodiment, the same effect can be produced by forming the first and second layers 81 and 82 which are deposited in different ambient atmospheres. Specifically, an atmosphere for formation of the second layer 82 includes more oxidizer than that for formation of the first layer 81. Therefore, the second layer 82 includes more oxidizer than the first layer 81.

For example, when a sputtering is performed, the first layer 81 is formed in the atmosphere where oxygen is added into argon by about 0.0001 to 1% while the second layer 82 is formed in the atmosphere where oxygen is added into argon by about 0.1 to 5% (more oxygen is set than in the atmosphere for formation of the first layer 81). It is natural that no oxygen may be added in the atmosphere for formation of the first layer 81 or oxidizing gas, instead of oxygen, such as $N_2O$ and $H_2O$ may be used.

It is known that the oxidizing gas is generally easy to adsorb and inhibits movement of atoms in a film surface where the oxidizing gas is adsorbed. Then, if the oxidizing gas is supplied by the degree as above in formation of the electrode, granular growth is caused in the second layer 82 to increase surface area and adherence. Moreover, with oxidation species included in the second layer 82, a reducing gas becomes hard to transmit. Therefore, it is possible to solve the first and second problems.

The Third Preferred Embodiment

FIGS. 17 to 22 are cross sections showing a method of manufacturing a semiconductor device in accordance with the third preferred embodiment of the present invention step by step. In these figures, only the region corresponding to the region P of FIG. 5 is shown.

Figure 17:
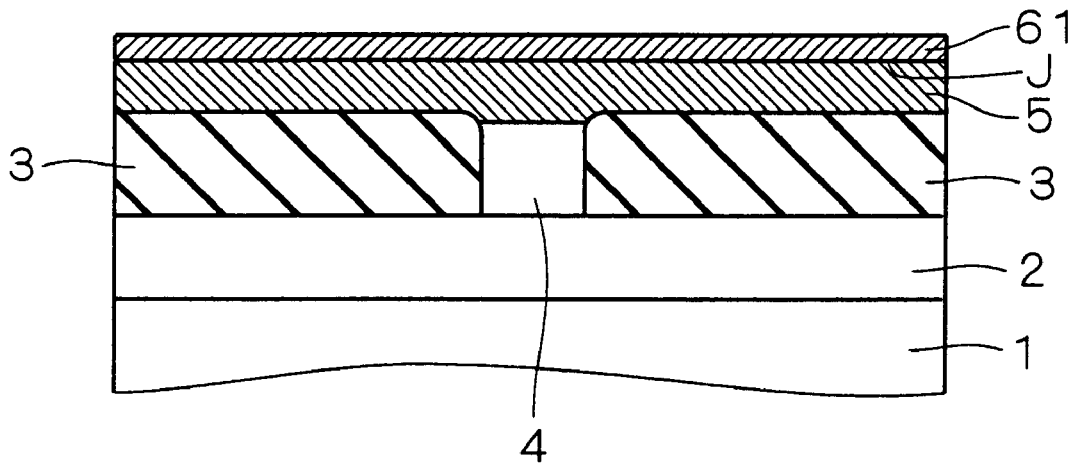
FIGS. 17 to 22 are cross sections showing a method of manufacturing a semiconductor device in accordance with a third preferred embodiment of the present invention step by step.
Figure 18:
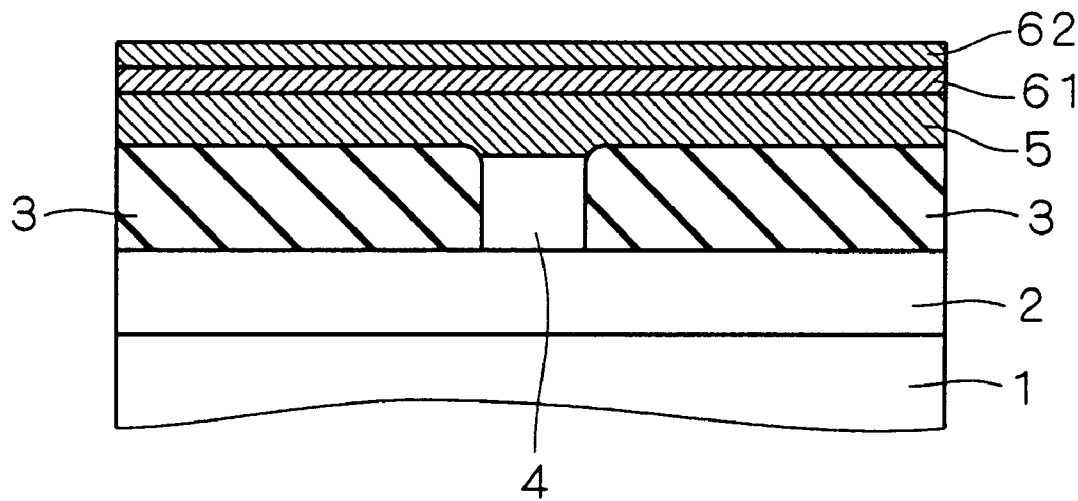

After obtaining the structure of FIG. 6 through the process shown in the first preferred embodiment, a first layer 61 is formed of a metal, especially, a precious metal, e.g., platinum on the barrier metal 5 by, e.g., sputtering to have a thickness of 250 to 750 Å, to obtain a structure of FIG. 17. At this time, it is desirable that the sputtering pressure should be about 0.2 Pa and the power should be lowered as possible, not so as to deteriorate productivity. For example, in an RF sputtering, the power is set at about 1 kW. The temperature in deposition is set high at about 250 to 400° C. Through this formation at such a high temperature, a chemical reaction is caused between the first layer 61 and the barrier metal 5. A compound of barrier metal and platinum is created in a boundary J therebetween.

A second layer 62 is formed of a metal, especially, a precious metal, e.g., platinum on the first layer 61 by, e.g., sputtering to have a thickness of 250 to 750 Å, to obtain a structure of FIG. 8. At this time, it is desirable that the sputtering pressure should be about 0.2 Pa and the power should be enhanced as possible. For example, in an RF sputtering, the power is set at about 2 kW. The temperature in deposition is set low, not higher than about 250° C.

Figure 19:
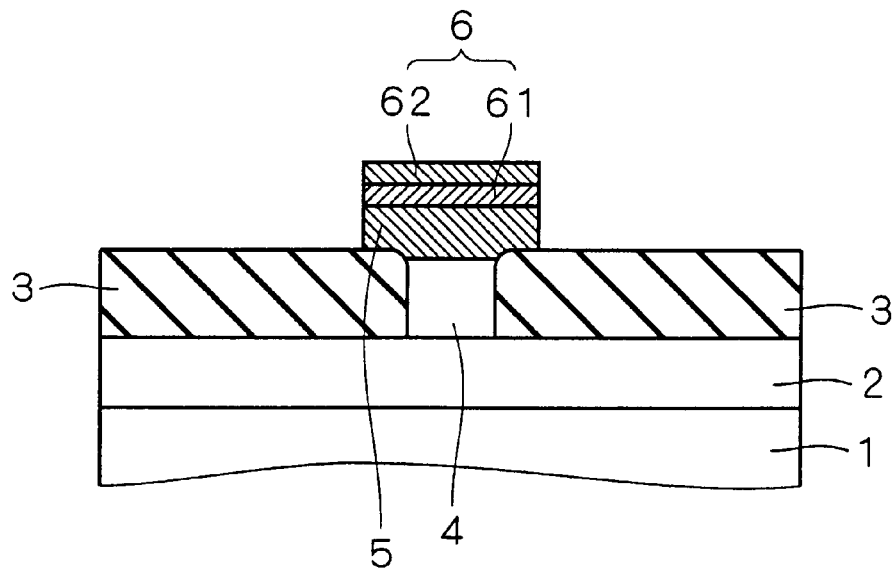
Figure 20:
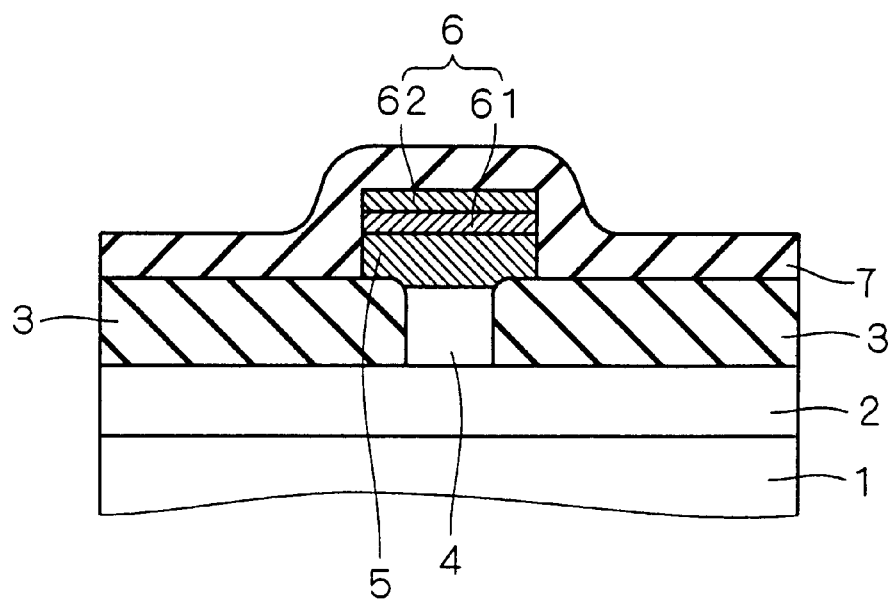
Figure 21:
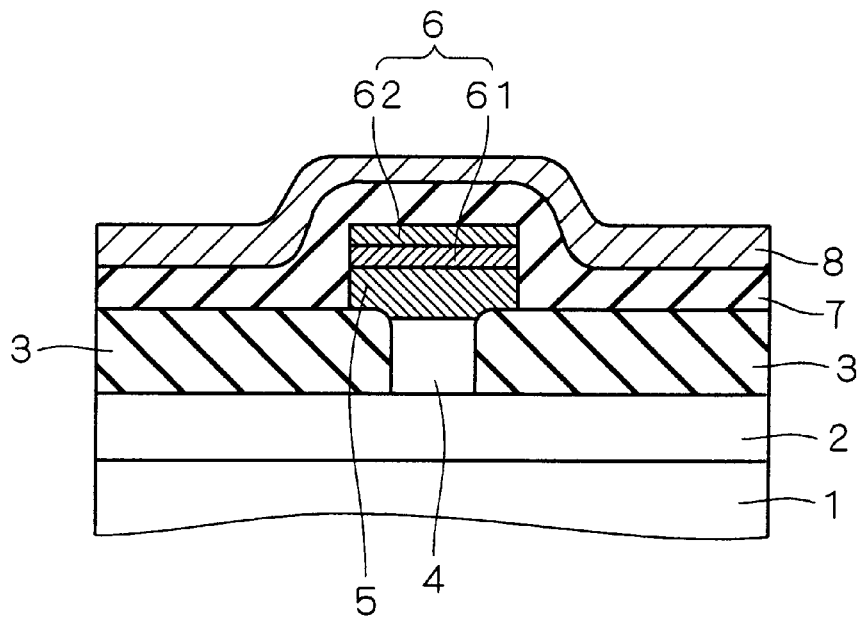
Figure 22:
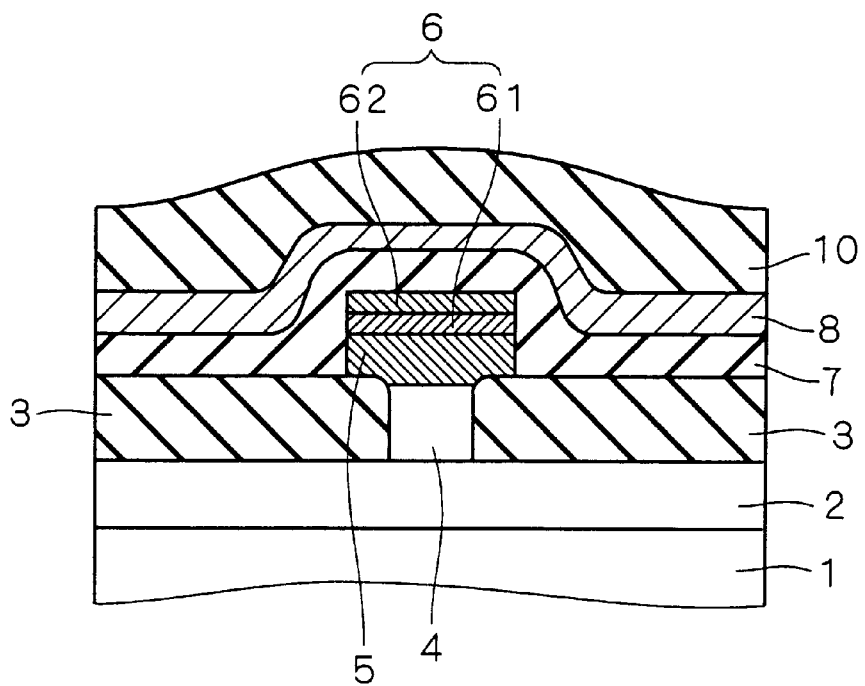

Photolithography and etching are performed on the first and second layers 61 and 62, forming the lower electrode 6 of the capacitor, to obtain a structure of FIG. 19. After that, the oxide dielectric film 7 is formed like in the first preferred embodiment, to obtain a structure of FIG. 20. On the oxide dielectric film 7, the upper electrode 8 is formed of, e.g., platinum by sputtering, to obtain a structure of FIG. 21. The interlayer insulating film 10 is formed on the upper electrode 8, to obtain a structure of FIG. 22. After that, the steps of FIGS. 13 to 16 in the first preferred embodiment are executed.

The lower electrode 6 thus obtained can have an evenness in an interface between the second layer 62 and the oxide dielectric film 7 and suppress electric field concentration.

Further, the high temperature in formation of the first layer 61 causes a chemical reaction between the first layer 61 and the barrier metal 5, forming a compound of barrier metal and, e.g., platinum, to improve adherence therebetween.

Furthermore, to enhance the above effect, it is desirable that unevenness of a surface of the second layer 62 (i.e., a surface of the lower electrode 6) is smaller than the thickness of the oxide dielectric film 7. More desirably, height difference from the top and bottom of the unevenness should not be larger than a tenth of the thickness of the oxide dielectric film 7. It is further desirable that a typical length in a horizontal direction (cycle of unevenness) should not be larger than half the size of storage node.

The Fourth Preferred Embodiment

Figure 23:
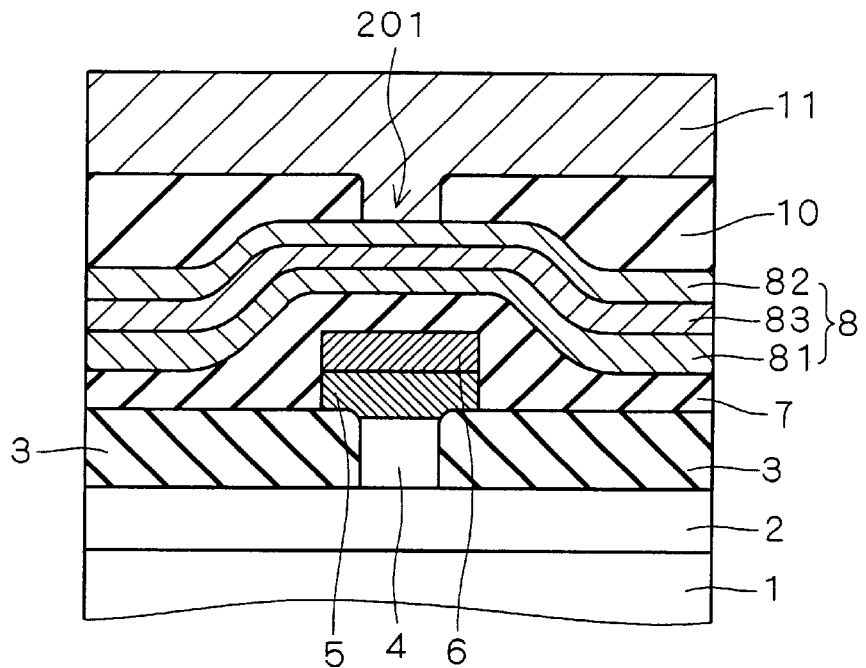
FIG. 23 is a cross section showing a semiconductor device in accordance with a fourth preferred embodiment of the present invention.

FIG. 23 is a cross section showing a semiconductor device in accordance with the fourth preferred embodiment of the present invention. In this figure, only the region corresponding to the region P of FIG. 5 is shown.

In this preferred embodiment, the upper electrode 8 has a structure in which a third layer 83 is formed between the first and second layers 81 and 82 shown in the first preferred embodiment. The third layer 83 is formed at higher temperature than the second layer 82. Specifically, the second layer 82 is formed at higher temperature than the first layer 81 and the third layer 83 is formed at higher temperature than the second layer 82. For example, the third layer 83 is formed at not lower than 300° C., higher temperature than the second layer 82.

The third layer 83 thus obtained is more crystallized than the second layer 82, to reduce grain boundary and increase grain size. Therefore, it is possible to suppress transmission of reduction species.

Further, even if the third layer 83 is formed, it is desirable that the second layer 82 should exist. For it is desirable that a top surface of the upper electrode 8 should have smaller crystal grains than the opening 201 in order to avoid variation of contact resistance between the second layer 82 and the aluminum interconnection layer 11 or plug 202 in contact therewith (see FIG. 14 or 16). This is desirable in terms of increasing a process margin.

Furthermore, like in the second preferred embodiment, the second layer 82 may have higher concentration of oxidizer than the first layer 81 and the third layer 83 may have higher concentration of oxidizer than the second layer 82. This is easily achieved by controlling the amount of oxidizer in ambient atmosphere for film formation. This can still enhance the effect of the second preferred embodiment.

Figure 24:
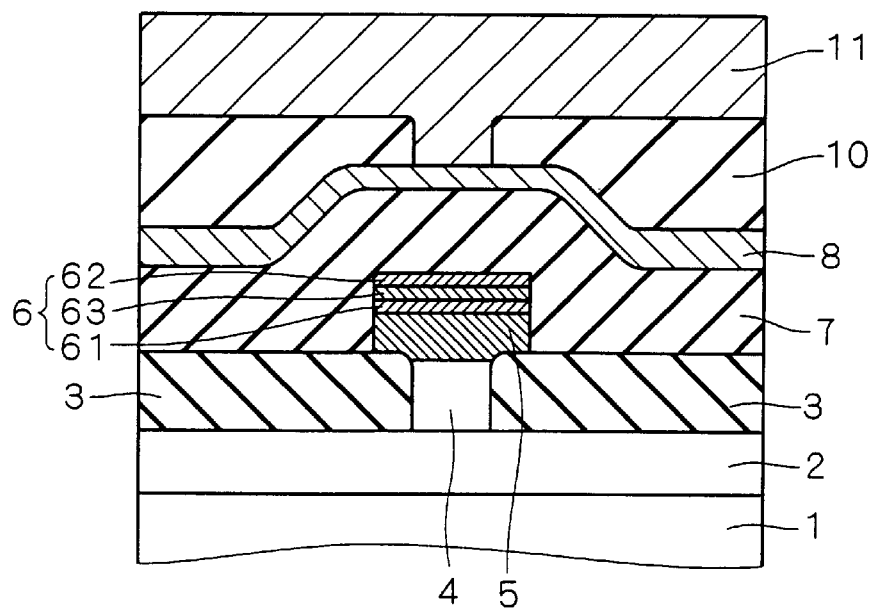
FIG. 24 is a cross section showing a variation of the semiconductor device in accordance with the fourth preferred embodiment of the present invention.

Also in the third preferred embodiment, a third layer 63 may be formed between the first and second layers 61 and 62 (see FIG. 24). The first layer 61 is formed at higher temperature than the second layer 62 and the third layer 63 is formed at higher temperature than the first layer 61. Providing the third layer 63 improves the effect of the third preferred embodiment.

VARIATION

The present invention can use materials other than those shown in the above preferred embodiments. For example, as materials for the upper electrode 8 and the lower electrode 6, ruthenium (Ru), an alloy (PtIr) of platinum and iridium, an alloy (PtRh) of platinum and rhodium or a conductive ceramic such as strontium ruthenate ($SrRuO_3$) may be used. As material of the oxide dielectric film 7, PZT (lead zirconate titanate; $Pb(Zr, Ti)O_3$) may be used.

While the invention has been shown and described in detail, the foregoing description is in all aspects illustrative and not restrictive. It is therefore understood that numerous modifications and variations can be devised without departing from the scope of the invention.

What is claimed is:

1. A capacitive element, comprising:
   a lower electrode;
   a dielectric layer formed on said lower electrode; and
   an upper electrode having a first layer formed on said dielectric layer and a second layer formed on said first layer,
   wherein said second layer has a grain size larger than that of said first layer.

2. The capacitive element according to claim 1, wherein said second layer is formed at a higher temperature than that of said first layer.

3. The capacitive element according to claim 1, wherein said second layer has a higher concentration of oxidizer than that of said first layer.

4. The capacitive element according to claim 3, wherein said second layer is formed in an atmosphere with a higher concentration of oxidizer than that of said first layer.

5. The capacitive element according to claim 1, wherein said upper electrode further includes a third layer formed between said first and second layers, and
   said third layer has a grain size larger than that of said first layer.

6. The capacitive element according to claim 5, wherein said third layer is formed at a higher temperature than that of said first and second layers.

7. The capacitive element according to claim 1, wherein said dielectric layer is formed of an oxide dielectric.

8. The capacitive element according to claim 7, wherein said upper electrode is formed of a precious metal.

9. A capacitive element, comprising:
   a substrate;
   a lower electrode formed on said substrate;
   a dielectric layer formed on said lower electrode and being thinner than said lower electrode; and
   an upper electrode formed on said dielectric layer,
   wherein unevenness in a surface of said lower electrode on a side facing said dielectric layer is not larger than a tenth of a thickness of said dielectric layer, and
   a cycle of said unevenness in a direction parallel with said substrate is not larger than half a size of said lower electrode in said direction parallel with said substrate.

10. The capacitive element according to claim 9, wherein said lower electrode has a first layer formed on said substrate and a second layer formed on said first layer, and
    said first layer is formed at a higher temperature than that of said second layer.

11. The capacitive element according to claim 9, wherein said lower electrode further includes a third layer formed between said first and second layers, and
    said third layer has a grain size larger than that of said first layer.

12. The capacitive element according to claim 11, wherein said third layer is formed at a higher temperature than that of said first and second layers.

13. The capacitive element according to claim 9, wherein said dielectric layer is formed of an oxide dielectric.

14. The capacitive element according to claim 13, wherein said upper electrode is formed of a precious metal.

* * * * *